(12) United States Patent
Elschner et al.

(10) Patent No.: US 6,577,657 B1
(45) Date of Patent: Jun. 10, 2003

(54) PLASTIC SUBSTRATE FOR SOLID-STATE LASER

(75) Inventors: Andreas Elschner, Mülheim (DE); Friedrich-Karl Bruder, Krefeld (DE); Rolf Wehrmann, Krefeld (DE); Rainer Friedbert Mahrt, Marburg (DE); Ullrich Scherf, Mainz-Kastell (DE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/261,655

(22) Filed: Mar. 3, 1999

(30) Foreign Application Priority Data

Mar. 6, 1998 (DE) .......................................... 198 09 696

(51) Int. Cl.[7] .............................. H01S 3/14; H01S 3/08

(52) U.S. Cl. ............................................ 372/39; 372/96

(58) Field of Search .............................. 372/96, 53, 92, 372/39

(56) References Cited

U.S. PATENT DOCUMENTS

| | | | |
|---|---|---|---|
| 4,379,070 A | 4/1983 | Tick ...................... | 252/301.16 |
| 4,539,507 A | 9/1985 | VanSlyke et al. ........... | 313/504 |
| 4,720,432 A | 1/1988 | VanSlyke et al. ........... | 428/457 |
| 5,247,190 A | 9/1993 | Friend et al. ................. | 257/40 |
| 5,307,363 A | * 4/1994 | Hosokawa et al. ........... | 372/53 |
| 5,581,398 A | 12/1996 | van Veggel et al. ........ | 359/342 |
| 5,881,089 A | * 3/1999 | Berggren et al. ............. | 372/92 |

FOREIGN PATENT DOCUMENTS

| | | |
|---|---|---|
| DE | 230 128 | 11/1985 |
| DE | 40 07 618 | 9/1991 |
| EP | 197 886 | 10/1986 |
| JP | 09-304750 A | * 11/1997 |

OTHER PUBLICATIONS

Schäfer, F.P., *Dye Lasers*, Springer–Verlag Berlin Heidelberg, New York, 1977, pp. 1–85. (No month available).

Kaminow, I.P., et al. Poly(Methyl Methacrylate) Dye Laser with Internal Diffraction Grating Resonator, Applied Physics. Letters, vol. 18, No. 11, Jun. 1, 1971, pp. 497–499.

Jewell, Jack, et al., Microlasers, Scientific American, Nov. 1991, pp. 86–94.

Kogelinik H. et al., Stimulated Emission in a Periodic Structure, Applied Physics Letters, vol. 18, No. 4, Feb. 15, 1971, pp. 152–154.

Domininghaus, Hans. Ing., Die Kunststoffe und ihre Eigneschaften, Verlag, 1992. p. 4.

Haisma, Jan, et al., Mold–assisted nanolithography: A process for reliable pattern replication, J. Vac. Sci, Technol. B 14(6), Nov./Dec. 1996, pp. 4124–4128.

Phohlmann, K., Compact Disc Hanbuch, IWT Verlag GmbH, 1994. (No month avail.).

Elias, Hans–Georg, *Makromolekule: Struktur*, Eigneschaften, 1981, p. 1070. New York: Hüthig & Wepf Verlag Basel.

Tessler, N., et al. Creating a Semiconducting–Polymer Laser. In: Laser und Uptoelektronik 29(5), 1997, pp. 54, 55. (No month available).

N. Deepak Kumar, et al., Solid–state tunable cavity lasing in a ply (para–phenylene vinylene) derivative alternating black co–polymer. In: Appl. Phys. Lett. 71 (8), Aug. 25, 1997, pp. 999–1001.

(List continued on next page.)

Primary Examiner—Quyen Leung
(74) Attorney, Agent, or Firm—Norris McLaughlin & Marcus

(57) ABSTRACT

A substrate (1) for a solid-state laser based on organic and/or inorganic laser material, and a solid-state laser are described, in which the substrate (1) consists of thermoplastic or thermoset and is structured on at least one surface (8), the structured surface (8) of the substrate (1) having a periodic surface profile (9).

41 Claims, 5 Drawing Sheets

OTHER PUBLICATIONS

Gu, G, et al.: Transparent organic Light ermitting devices. In: Appl. Phys. Lett. 68 (19) May 6, 1996, pp. 2606–2608.

Petty, M.C.: Molecular electronics: prospects for instrumentation and measurement science. In: Meas. Sci. Techol., 1996, pp. 725–735. (No month available).

Kuwata–Gonokami, M., et al., Polymer microdisk and microring lasers. In: Optics Letters, Oct. 15, 1995, vol. 20, No. 20, pp. 2093–2095.

Ammermann, Dirk, et al.: Photonic Devices Based Crystalline and Organic Semiconductors for Optoelectronic Integrated Circuits. In: Jpn. J. Appl. Phys., vol. 34, Part 1, No. 2B, Feb. 1995, pp. 1293–1297.

Chen, R.T.: Polymer–based photonic integrated circuits. In: Optics & Laser Technology, vol. 25, No. 6, 1993, pp. 347–365. (No month available).

Rochon, P., Batalla, E.: Optically induced surface gratings on azoaromatic polymer films. In: Appln. Phys. Lett. 66(2) Jan. 9, 1995, pp. 136–138.

Dodabalapur, A., et al., Resonators and Materials for Organic Lasers Based on Engergy Transfer, In: IEEE Journal of Selected Topics in Quantum Electronics, vol. 4, No. 1, 1998, pp. 67–74. Jan./Feb. 1998.

* cited by examiner

PLASTIC SUBSTRATE FOR SOLID-STATE LASER

The invention relates to a substrate for a solid-state laser based on organic and/or inorganic laser material and to a solid-state laser, in which the substrate consists of thermoplastic or thermoset and is structured on at least one surface, the structured surface of the substrate having a periodic surface profile.

BACKGROUND OF THE INVENTION

Solutions of fluorescent molecules in organic solvents have been used in dye lasers for many years. The fluorescent molecules used are distinguished by a high fluorescent efficiency, a wide tuning range, and the fact that they are very stable against oxidation and are easy to process. Dye lasers have become widely accepted and used worldwide. They are primarily employed when intense collimated monochromatic light is to be supplied with the possibility of tuning it in a wide wavelength range. Examples of dye lasers are described in Schäfer F. P. (ed.), Dye Lasers, 2nd Ed., Topics in Applied Physics, Vol. 1 (Springer, Berlin, Heidelberg, N.Y. 1978).

Disadvantages with dye lasers are that there is little possibility of scale reduction, they are expensive to produce, it is comparatively difficult to process the dye solutions used in the dye lasers and the problems with disposing of these solutions.

At the same time, construction and alignment of the optical resonator is intricate and requires experienced personnel. These disadvantages prevent the use of dye lasers on a mass-produced scale, as laser diodes made of inorganic material have in optoelectronic applications over recent years.

The discovery of electroluminescence in polymer layers (cf. e.g. U.S. Pat. No. 5,247,190) and molecular layers deposited using vacuum techniques (cf. e.g. Patents U.S. Pat. No. 4,720,432 and U.S. Pat. No. 4,539,507) and the work prompted by these have aroused great interest in organic light-emitting diodes intended to be used in the field of optoelectronics. The progress made in recent years with the development of organic light-emitting diodes is likely to yield a commercial application in the near future. The initial difficulties with rapid ageing of organic light-emitting diodes have been satisfactorily solved by optimizing the multilayer structure, refining the cathodes and improved encapsulation. One first broad field of application for organic light-emitting diodes will be the field of luminescent displays and background lighting panels.

The increase in efficiency achieved with organic light-emitting diodes has made it likely that organic laser diodes, which can be excited to emit light by applying an electric field, will be developed in the near future. Organic laser diodes differ from organic light-emitting diodes in that they involve amplified spontaneous emission. The consequence of this is that organic laser diodes can emit collimated polarized light. The emitted light furthermore has a narrow bandwidth compared with its wavelength, and the radiation density is higher than in organic light-emitting diodes.

In electrically or optically excited lasers, special substrates can be used to lower the lasing threshold and define the emission wavelength. With inorganic lasers (semiconductor lasers), it has been found particularly suitable to use substrates which form a DBR (Distributed Bragg Reflector) or a DFB (Distributed Feedback) laser. A factor common to both substrates is that they have a periodic structure, the period being of the order of the wavelength of visible light, i.e. about 200–2000 nm.

The periodic structure in DBR substrates consists of a multilayer system in which thin films having different refractive indices are applied alternately to a transparent plane-parallel substrate. This structure was first proposed by I. P. Katinov et al., Appt. Phys. Lett., 18, 497–499, (1971). With DBR substrates, the amplified light emission is perpendicular to the substrate surface. Such substrates are used to make VCSELs (Vertical Cavity Surface Emitting Lasers), as described in "Jewell et al.; Scientific American, November 1991". In technical terms, DBRs are produced by successive vacuum deposition of individual inorganic metal oxide layers such as $SiO_2$ and $TiO_2$. This process is elaborate and cost-intensive.

Conversely, DFB substrates have a periodically structured surface. In DFB lasers, the amplified light emission is parallel to the surface and perpendicular to the periodic structure, as described in Kogelnik, H. Shank, C. V. "Stimulated Emission in a Periodic Structure", Appl. Phys. Lett. 18, 152–54 (1971). In technical terms, the periodic surface structure is formed by photolithographically etching inorganic substrates, so that an alternating sequence of ridges and furrows in formed in the substrate. This photolithographic etching process is elaborate and expensive.

There is therefore a requirement to develop a substrate for a solid-state laser, which can be produced straightforwardly and which, in particular, is suitable for use in lasers having organic laser material.

SUMMARY OF THE INVENTION

The object is achieved according to the invention by a substrate for a solid-state laser based on organic and/or inorganic laser material, which forms the subject-matter of the invention and is characterized in that the substrate consists of thermoplastic or thermoset and is structured on at least one surface, and in that the structured surface of the substrate has a periodic surface profile.

In particular, the substrate has periodically arranged ridges and troughs on its structured surface in at least one cross section through the substrate, the period being from 50 to 10,000 nm, preferably from 80 nm to 10,000 nm, particularly preferably from 80 nm to 5000 nm and quite particularly preferably between 100 nm and 5000 nm.

The substrate preferably has lateral periodicity in at least one direction in space, the number of periods being at least 5, preferably at least 10.

In a preferred embodiment, the depth of the surface profile is from 1 nm to 100 $\mu$m, preferably from 5 nm to 30 $\mu$m.

DETAILED DESCRIPTION

The profile of the periodic surface structure is arbitrary. Suitable examples are periodic geometrical profiles, in a cross section through the surface of the substrate, such as a sinusoidal, rectangular, trapezoidal or sawtoothed profile or a combination of these profile shapes. Pyramidal structures are also possible. Rectangular and trapezoidal profiles are particularly suitable.

The period of the ridges and troughs is not limited to a single period length (wavelength). Superposition or juxtaposition of up to 100 periodic profiles with different period lengths is also suitable. It is particularly suitable to superpose up to 10 periodic profiles with different period lengths.

The plastic for the substrate is preferably a plastic selected from the following list: polycarbonate, poly(methyl)

acrylate, (meth)acrylate copolymers, polystyrene and styrene copolymer, poly-α-methylstyrenes, acrylonitrile polymer, styrene/acrylonitrile copolymer, ABS, vinylpolymer, poly(cyclo)olefin, polysulphone, polyether sulphone, polyester, polyester carbonate, polyether carbonate, polyvinyl chloride and polyvinylcarbazole.

Further examples of suitable thermoplastics and/or thermosets are described in the "Encyclopaedia of Polymer Science and Engineering", 2nd Edition, John Wiley & Sons, and in Hans Domininghaus, "Die Kunstoffe und ihre Eigenschaften" [Plastics and their Properties] 4th Edition 1992, VDI-Verlag GmbH, Düsseldorf. All transparent plastics can in general be used.

Suitable thermosets include, in particular, reactive resins in which a periodic surface profile can be formed by casting, compression moulding, injection moulding or reactive injection moulding and photopolymerization on at least one of the surfaces of the substrate. All the materials which can be processed using the methods described above are suitable as reactive resins, in particular those which exhibit little reduction in volume during the reaction.

The substrate can be produced using a variety of methods, in particular by injection moulding, hot press moulding, casting, compression moulding, reactive injection moulding, photopolymerization or laser ablation.

The production methods for thermoplastic or thermoset substrates are more cost-effective compared with the production methods for conventional substrates, and in particular are suitable for mass production.

The substrates according to the invention will also be referred to below as a thermoplastic or thermoset DFB substrate.

A thermoplastic DFB substrate according to the invention can be produced by transferring a surface profile defined in a die by injection moulding or hot press moulding to the thermoplastic substrate. It is possible to transfer surface structures having the aforementioned dimensions using thermoplastics, which can for example in principle be demonstrated by the similar production of a recordable compact disc (blank). (The blank has, for example, a typical difference between ridges and troughs of 150 nm, a trapezoidal profile and a period of 1600 nm).

A thermoset DFB substrate according to the invention can also be produced by fixing a surface profile defined in a die in a medium (reactive resin) whose curing is initiated thermally, chemically or photochemically. It is likewise possible to transfer surface structures having the aforementioned dimensions, which can in principle be demonstrated for example by the similar production of a double-layer digital versatile disc (DVD). One of these has, for example, a typical difference between ridges and troughs of 80 nm, a trapezoidal pit profile and a period of 780 nm. Further examples of moulding methods which are basically suitable can be found in Haisma, J. Verheijen, M. van den Heuvel, K. van den Berg, J. "Mold-assisted nanolithography: A process for reliable pattern replication", J. Vac. Sci. Technol. B (146), November/December 1996.

The dies can be produced using basically known methods, such as photoresist, non-photoresist and direct-metal patterning as described in Pohlmann, K. "Compact Disc Handbuch", [Compact Disc Handbook], IWT Verlag GmbH Vaterstetten near Munich (1994).

The invention also relates to a solid-state laser based on organic and/or inorganic laser material consisting at least of a substrate structured on its surface and a layer of an organic and/or inorganic laser material applied to the structured substrate, characterized in that the structured substrate consists of thermoplastic or thermoset, and in that the surface structure of the substrate has a periodic surface profile.

The thermoplastic or thermoset DFB substrate according to the invention can be used to make a laser from organic and/or inorganic laser material.

A preferred embodiment of the solid-state laser is characterized in that the substrate is a substrate according to the invention and the laser material is applied to the structured surface of the substrate.

The structured surface is preferably provided with an additional inorganic, in particular metallic, intermediate layer.

The intermediate layer consists in particular of a metal from the following list: aluminium, silver, copper, magnesium and gold, or of an oxide from the following list: titanium dioxide, aluminium oxide, silicon dioxide and indium tin oxide.

Distinction can be made between two different possible structures of a preferred solid-state laser, which depend on the type of laser excitation (i.e. by the pumping process).

1. Optically Pumped Organic Lasers:

In the case of an optically pumped organic laser, the structure may be as represented in FIG. 5a: one or more organic layers, of which at least one layer is photoluminescent, are applied to the periodic height profile of the DFB substrate according to the invention. The individual layers can be applied by known methods, for example pouring, spin coating, laminating or thermal deposition. Further layers, for example vacuum-deposited metal or insulator layers, may be arranged between the organic layer system and the thermoplastic DFB substrate. Layer thicknesses of 2–10,000 nm, preferably 10–5000 nm, are suitable. The organic layer system has, in particular, a thickness of 5–50,000 nm, preferably 10–20,000 nm, particularly preferably 10–10,000 nm. A semitransparent metal layer may be applied as a reflection layer to the organic layer system.

The organic laser is optically excited (pumped) by for example focusing laser light from an excitation laser using a cylindrical lens perpendicular to the periodic ridges. The light emission from the organic laser then emerges at the end faces, parallel to the surface and perpendicular to the periodic structure.

2. Electrically Pumped Organic Lasers:

In the case of an electrically pumped organic laser, the structure may be as represented in FIG. 5b: an electrode is applied to the periodic height profile of a DFB substrate according to the invention. This electrode may consist of a transparent conductive oxide (e.g. ITO) or of a vacuum-deposited metal layer. Layer thicknesses of 2–10,000 nm, preferably 10–5000 nm are suitable. One or more organic layers are applied to this electrode, one of the layers being photoluminescent. The individual layers may be applied either using known methods, for example by pouring, spin coating, laminating or pressure, or by thermal deposition.

To provide the other electrode, a metal layer or a transparent conductive oxide (e.g. ITO) is applied to this organic layer system. The layer thickness of the organic layer system between the electrodes is 5–5000 nm, preferably 10–2000 nm, particularly preferably 20–1000 nm.

The organic laser is electrically excited by applying an electric voltage to the two electrodes, which makes a current flow through the organic layer system. The emission emerges at the end faces parallel to the surface and perpendicular to the periodic structures.

A preferred solid-state laser is characterized in that it has at least one lasing layer, which fully or partially comprises an organic material and has photofluorescent properties. Suitable materials are ones which can preferably be applied to the substrate in the form of a solution, such as conjugated polymers, e.g. poly(phenylenevinylenes), substituted poly (phenylenevinylenes) MEH-PPV, poly(phenylenevinylene copolymers), poly(paraphenylenes), poly(thiophenes) or main-chain and side-chain polymers having photofluorescent units, e.g. distyrylenes, and furthermore mixtures of polymer binders e.g. polystyrene, polycarbonate, PMMA with fluorescent compounds, e.g. coumarins, perylenes, phthalocyanines or other fluorescent oligomers, e.g. phenylenevinylenes, or with fluorescent inorganic compounds, e.g. CdS, CdSe. Other suitable materials include ones which can be vapour-deposited on the substrate or applied from solution, such as low molecular-weight fluorescent compounds, e.g. coumarins, perylenes, phthalocyanines, stilbenes, distilbenes or metal complexes, e.g. tris(8-hydroxyquinoline) aluminium.

The laser according to the invention can be used wherever collimated intense monochromatic polarized light is needed. A particular advantage of organic laser diodes is the possibility of applying the light-emitting layers using simpler and therefore more economical processes, such as vapour deposition and coating. This method leads to considerably lower production costs. A further advantage is that, with organic laser diodes, the wavelength of the laser emission can be adjusted within the wide-spectrum emission bands of the organic material, as with dye lasers, and is not limited to just one wavelength.

Because it is straightforward to produce, the thermoplastic or thermoset substrate with a periodic surface structure according to the invention can be used as a cost-effective substrate for organic DFB lasers. In particular, it is suitable for mass production. The DFB structure of the thermoplastic or thermoset substrate permits well-defined selection of the wavelengths of the emitted light, reduction of the FWHM (full width at half maximum) of the emitted light and unexpectedly leads to a reduction in the laser threshold.

The invention will be explained in more detail below by way of example with reference to the figures, in which:

EXAMPLES

Figure 5A:
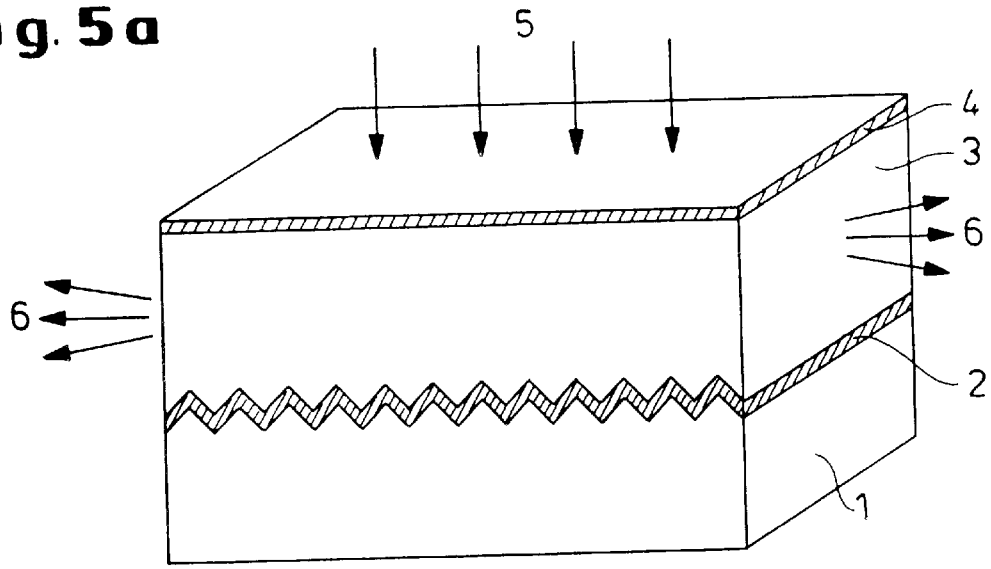
FIG. 5 shows a schematic representation of the solid-state laser according to the invention which is a) optically pumped or b) electronically pumped.

A laser constructed with the substrate according to the invention has, for example, the following structure (FIG. 5a).

A metal layer 2 is applied to the plastic substrate 1 and separates the substrate 1 from the laser layer 3. It is also possible to have a semitransparent reflective layer 4 on the laser layer 3.

Figure 5B:
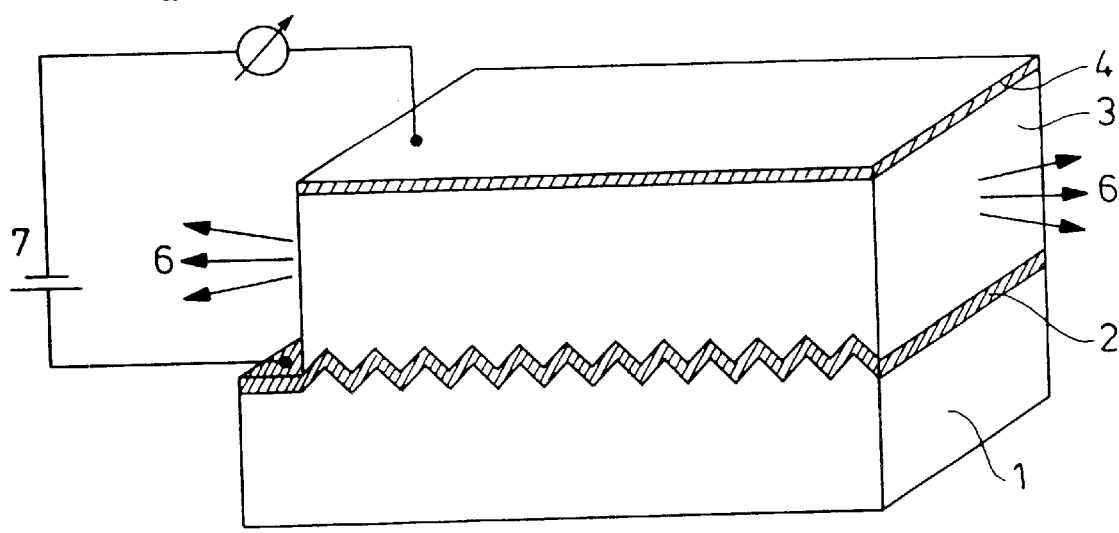

In one variant (FIG. 5b), the laser material 3 is excited by means of electric current from a current source 7 through the layers 2 and 4, in order to create a population inversion in the material 3.

Example 1

Figure 1:
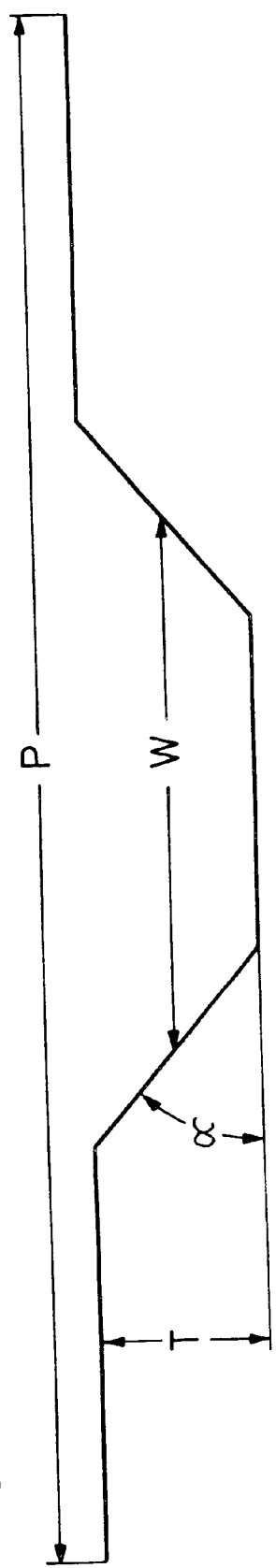
FIG. 1 shows a schematic representation of a trapezoidal groove in the substrate 1.

In order to produce a thermoplastic DFB substrate 1, a round blank, which is also in principle usable for recordable compact discs, was injection moulded. Production was carried out by transferring the surface structure of a die in the injection mould. Polycarbonate was used as the substrate material. The blank had an outwardly spiralling groove on one face. The grooves 11 were dense enough to be considered parallel in the radial direction. The period P of the groove structure was 1600 nm viewed in the radial direction. The grooves 11 had a trapezoidal cross section. The gradient a was 36°. The depth T of the grooves 11 was 145 nm, and the width W at half depth of the grooves 11 was 500 nm. (see FIG. 1)

The periodically structured surface of the substrate 1 produced in this way was coated surface-wide with an aluminium layer 2 in a vacuum deposition system (Leybold). During the deposition, the pressure in the apparatus was <1 Pa. The thickness of the aluminium layer was 100 nm.

Figure 4:
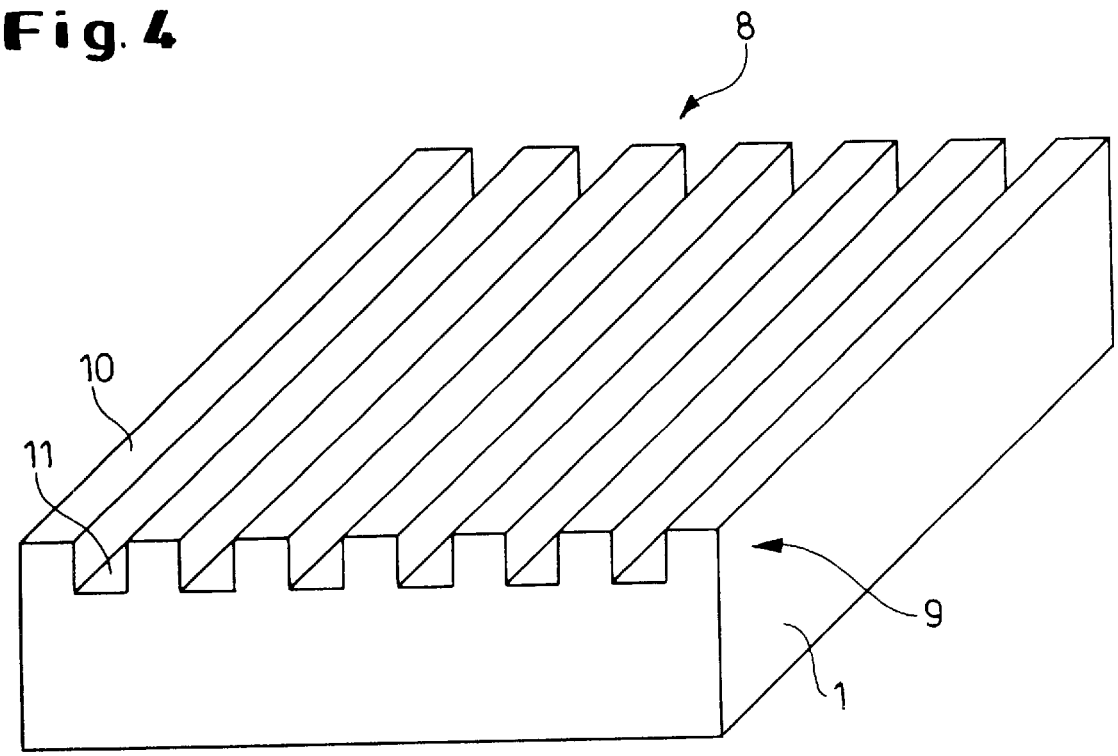
FIG. 4 shows a schematic representation of the substrate 1.

The substrate 1 was cut into small, approximately 1 $cm^2$ large square pieces (see FIG. 4) as the actual substrates for the laser. The edges of the cuts were finished with a milling machine.

A thin film 3 of a fluorescent polymer was applied to these substrates 1. This polymer was a conducting polymer as described by U. Scherf and K. Müllen in Makromol. Chem. Rapid Commun. 12 (1991) 489. A 2% strength solution of this polymer in chloroform was cleaned by spray filtering with a 0.2 $\mu$m pore size. The filtered solution was applied to the substrate and the excess solution was removed using a spin coater under clean-room conditions (clean-room class 1000) the speed of the spin coater was 1800 rpm. The dried polymer film 3 had a layer thickness of about 100 nm±10%. The samples obtained in this way were stored in a protective gas atmosphere. A control sample was then produced under the same conditions on a quartz glass substrate.

The samples were fastened on a sample holder in order to be optically characterized. The samples were excited using a tunable XeCl excimer laser pumped dye laser system (Lambda Physics) which was set to an emission wavelength of 450 nm. The excitation light 5 was focused on the sample using a cylindrical lens having a focal length of 3 cm. The size of the light spot was 1 cm×50 $\mu$m. All the experiments were carried out in air at room temperature. The light 6 emerging at the end of the sample was picked up by an optical multichannel analyser using a CCD camera. The pulse length of the excitation laser was 10 ns. The intensity of the excitation laser was set by means of neutral glass filters. The energy per pulse was determined using an energy-measuring instrument.

Figure 2:
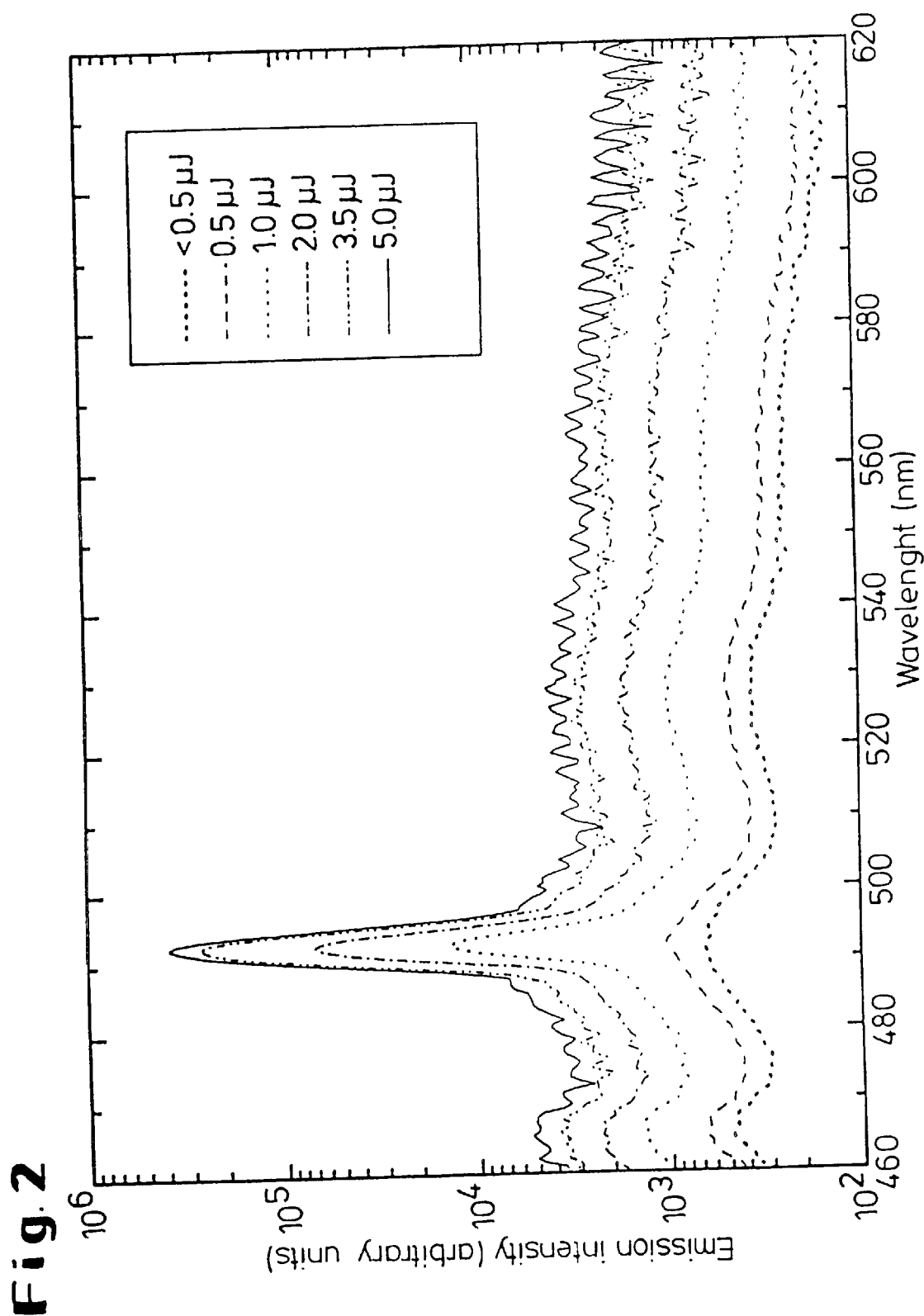
FIG. 2 shows the emission intensity of a solid-state laser according to the invention, corresponding to example 1, as a function of wavelength.

The spectral profile of the light emitted by the solid-state laser (with DFB substrate) is represented for various pulse energies in FIG. 2. The pronounced narrow-band emission with a maximum at 493 nm for pulse energies E>0.5 $\mu$J can clearly be seen. At E =5$\mu$J, the FWHM of this narrow band is 2.5 nm, the spectral resolution of the detection system being about 2 nm. The emission band at 493 nm is 25 nm if excitation is carried out with energies of less 0.5 $\mu$J.

Figure 3:
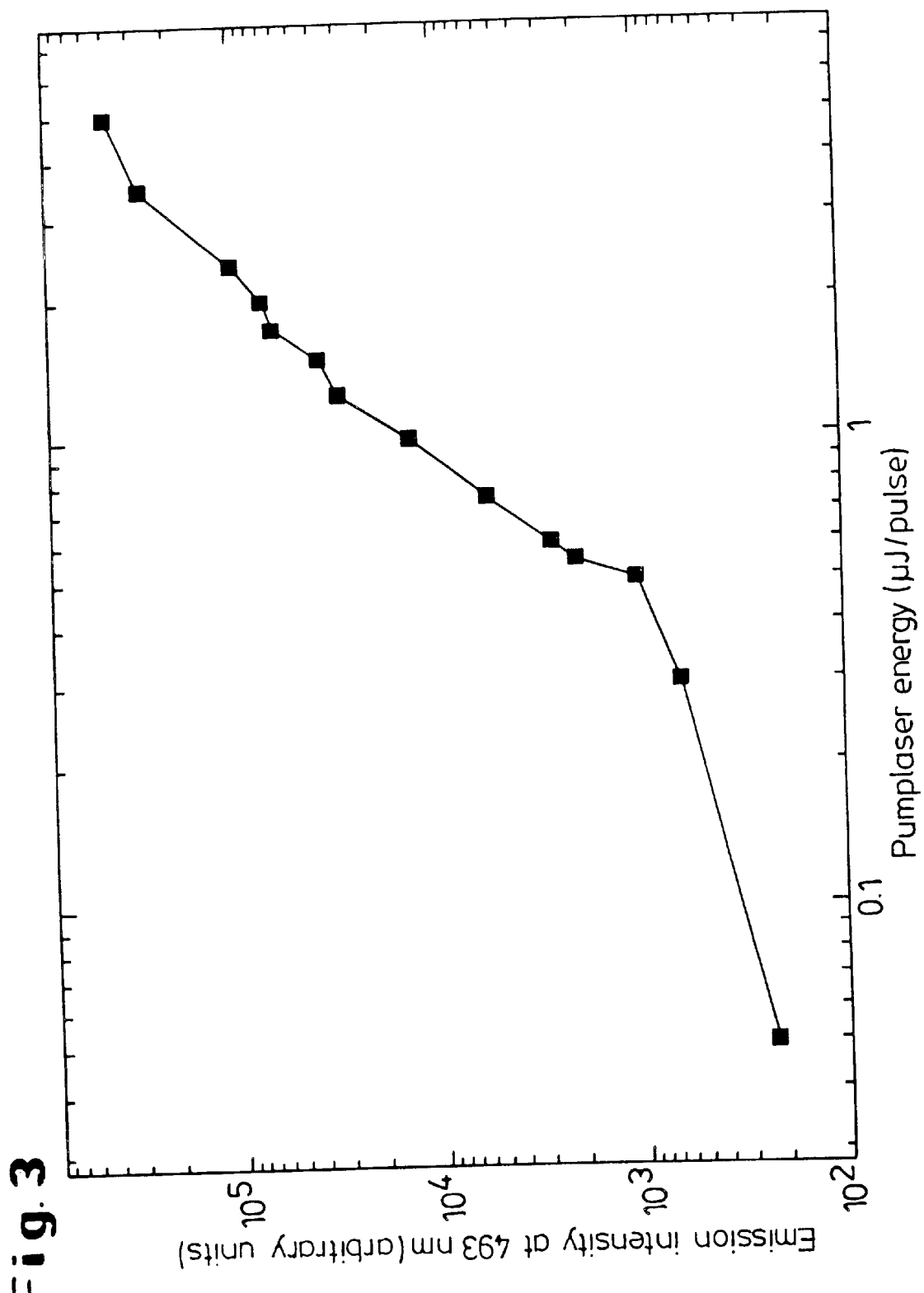
FIG. 3 shows the emission intensity at 493 nm as a function of different pumping energies.

The intensity of the light emitted at 493 nm is plotted against the pump energy with a log-log scale in FIG. 3. In this plot, the kink in the slope at 0.5 $\mu$J/pulse marks the starting value for the laser emission (threshold). With the control sample on a quartz substrate (not according to the invention), the threshold is 20 $\mu$J and the FWHM of the emission band with a maximum at 493 nm is 4.5 nm for a pulse energy of 50 $\mu$J.

The results show that the use of an injection-moulded thermoplastic DFB substrate 1 gives a marked reduction in the emission threshold for laser emission, and furthermore a reduction in the linewidth of the emission compared with a laser having a conventional quartz substrate.

What is claimed is:

1. A pumpable, distributed feedback, solid state laser structure comprising a substrate structured on its surface with periodic ridges separated by troughs to form a distributed feedback grating and a layer of organic laser material, inorganic laser material or both adjacent the substrate and with a surface facing the substrate structure surface and having the configuration of the structured substrate surface wherein the substrate is a thermoplastic or thermoset plastic material with molded material of the substrate forming the ridges and troughs.

2. Solid-state laser structure according to claim 1, wherein the laser material is in contact with the structured surface of the substrate.

3. Solid-state laser structure according to claim 1, wherein there is an inorganic layer intermediate the structured surface of the substrate and the laser material and the inorganic layer has the configuration of the structured surface.

4. Solid-state laser structure according to claim 1, wherein the inorganic layer comprises a metal selected from the group consisting of aluminium, silver, copper, magnesium and gold; or of an oxide selected from the group consisting of titanium dioxide, aluminium oxide, silicon dioxide and indium zinc oxide.

5. Solid-state laser structure according to claim 1, wherein the laser material comprises an organic material which has photofluorescent properties.

6. Solid-state laser structure according to claim wherein said organic material having photofluorescent properties is selected from the group consisting of conjugated polymers, mixtures of polymer binders with fluorescent molecules, or with fluorescent inorganic compounds.

7. Solid-state laser structure according to claim 1, wherein said laser material comprises a fluorescent inorganic compound.

8. Solid-state laser structure according to claim 7, wherein said inorganic compound is Cds or CdSe.

9. Solid-state laser structure according to claim 5, wherein said laser material is a member of the group consisting of poly(phenylenevinylene), substituted poly (phenylenevinylene), MEH-PPV, poly(phenylenevinylene) copolymers, poly(paraphenylenes), and polythiophenes.

10. Solid-state laser structure according to claim 5, wherein said laser material comprises a main-chain or side-chain polymer having photofluorescent units.

11. Solid-state laser structure according to claim 10, wherein said photofluorescent units are distyrylenes.

12. Solid-state laser structure according to claim 9, wherein said laser material comprises mixtures of polymer binders with fluorescent molecules selected from the group consisting of coumarins, perylenes, phthalocyanines, and phenylenevinylenes.

13. Solid-state laser structure according to claim 1, wherein the laser material contains a low molecular-weight compound and is a material which is affixed to the substrate by evaporation coating or from a solution.

14. Solid-state laser structure according to claim 13, wherein the laser material is selected from the group consisting of coumarins, perylenes, phthalocyanines, stilbenes, distilbenes, and tris(8-hydroxyquinoline)aluminium.

15. Solid-state laser structure according to claim 13, wherein the low molecular weight compound is at least one of the group of fluorescent compounds consisting of coumarins, perylenes, phthalocyanines, stilbenes, distilbenes and tris(8-hydroxyquinoline) aluminium.

16. Solid-state laser structure according to claim 3, wherein the laser material contains a low molecular-weight compound and is a material which is affixed to the inorganic layer by evaporation coating or from a solution.

17. Solid-state laser structure according to claim 16, wherein the laser material is selected from the group consisting of coumarins, perylenes, phthalocyanines, stilbenes, distilbenes, and tris(8-hydroxyquinoline)aluminium.

18. Solid-state laer structure according to claim 1, wherein said thermoplastic or thermoset plastic material is a material selected from the group consisting of poly-α-methylstyrene, acrylonitrile polymer, styrene/acrylonitrile copolymer, ABS, vinylpolymer, poly(cyclo)olefin, polysulphone, polyether sulphone, polyester, polyester carbonate, polyether carbonate, polyvinyl chloride and polyvinylcarbazole.

19. Solid-state laser structure according to claim 1, wherein the plastic material for the substrate is selected from the group consisting of polycarbonate, (methyl)acrylic copolymer, polystyrene and styrene copolymers.

20. Solid-state laser structure according to claim 1, wherein the substrate has periodically arranged ridges and troughs on its structured surface in at least one cross section through the substrate, the period being from 50 to 10,000 nm.

21. Solid-state laser structure according to claim 20, wherein the period of the ridges and troughs is from 80 nm to 10,000 nm.

22. Solid-state laser structure according to claim 20, wherein the period of the ridges and troughs is from 80 nm to 5000 nm.

23. Solid-state laser structure according to claim 22, wherein the period of the ridges and trough is from 100 nm to 5000 nm.

24. Solid-state laser structure according to claim 1, wherein the substrate has lateral periodicity in at least one direction in space, the number of periods being at least 5.

25. Solid-state laser structure according to claim 24, wherein the lateral periodicity is at least 10.

26. Solid-state laser structure according to claim 1, wherein the depth of the surface profile is from 1 nm to 100 $\mu$m.

27. Solid-state laser structure according to claim 26, wherein the depth of the surface profile is from 5 nm to 30 $\mu$m.

28. Solid-state laser structure according to claim 1, wherein the surface profile is a sinusoidal, rectangular, trapezoidal or sawtoothed profile or a combination of such profile shapes, in a cross section through the surface of the substrate.

29. Solid-state laser structure according to claim 28, wherein said surface profile is a rectangular or trapezoidal profile.

30. Solid-state laser structure according to claim 1, wherein said periodic surface profile has at least ten different periodic lengths in cross section through the surface of the substrate.

31. A solid-state laser with a selective feedback grating and a layer of an organic or inorganic lasing material or both which is pumpable to provide laser energy emission, said laser comprising:

a substrate of thermoplastic or thermoset plastic material which is structured on a surface of the substrate with periodic ridges separated by troughs to provide the feedback grating, the period of the ridges being selected to provide the desired lasing wavelength or wavelengths and the ridges being formed by the material of the substrate and being integral with the substrate;

a layer of organic laser material, inorganic laser material or both overlying the ridges and troughs of the substrate with a surface facing the ridges and troughs which has the configuration of the ridges and troughs.

32. A method of making a pumpable, distributed feedback laser structure which comprises:

providing thermoplastic or thermoset plastic material for a substrate with a surface;

molding the plastic material to provide a substrate with a surface having periodic ridges and grooves for a distributed feedback grating;

joining a layer of organic laser material, inorganic laser material or both with the substrate so that a surface of the layer faces the surface of the substrate with the ridges and grooves and the surface of the layer has the configuration of the ridges and grooves.

33. The method according to claim 32, further comprising applying a further layer of material to the surface of the substrate having the periodic ridges and grooves to thereby provide periodic ridges and grooves in the further layer corresponding to the ridges and grooves of the substrate surface and the layer of laser material is applied to the layer of inorganic material.

34. The method according to claim 33, wherein the further layer is a layer of inorganic material.

35. The method according to claim 34 in which the inorganic material is a metal selected from the group consisting of aluminium, silver, copper, magnesium and gold; or of an oxide selected from the group consisting of titanium dioxide, aluminium oxide, silicon dioxide and indium zinc oxide.

36. The method according to claim 32, wherein said thermoplastic or thermoset plastic material is a material selected from the group consisting of poly-α-methylstyrene, acrylonitrile polymer, styrene/acrylonitrile copolymer, ABS, vinylpolymer, poly(cyclo)olefin, polysulphone, polyether sulphone, polyester, polyester carbonate, polyether carbonate, polyvinyl chloride and polyvinylcarbazole.

37. The method according to claim 32, wherein the plastic for the substrate is selected from the group consisting of polycarbonate, (methyl)acrylic copolymer, polystyrene and styrene copolymers.

38. The method according to claim 32, wherein the plastic material is injection molded.

39. The method according to claim 38, wherein the plastic material is reactive injection molded.

40. The method according to claim 32, wherein the plastic material is hot press molded.

41. The method according to claim 32, wherein the plastic material is compression molded.

* * * * *

UNITED STATES PATENT AND TRADEMARK OFFICE
CERTIFICATE OF CORRECTION

PATENT NO. : 6,577,657 B1
DATED : June 10, 2003
INVENTOR(S) : Elschner et al.

It is certified that error appears in the above-identified patent and that said Letters Patent is hereby corrected as shown below:

Column 7,
Line 33, "according to claim wherein" should read -- according to claim 5 wherein --

Column 8,
Line 12, "laer structure" should read -- laser structure --

Signed and Sealed this

Eighteenth Day of January, 2005

JON W. DUDAS
*Director of the United States Patent and Trademark Office*